United States Patent
Nagel

(10) Patent No.: US 9,496,424 B2
(45) Date of Patent: Nov. 15, 2016

(54) CRYSTALLINE SOLAR CELL, METHOD FOR PRODUCING SAID TYPE OF SOLAR CELL AND METHOD FOR PRODUCING A SOLAR CELL MODULE

(75) Inventor: Henning Nagel, Alzenau (DE)

(73) Assignee: SCHOTT SOLAR AG, Mainz (DE)

( * ) Notice: Subject to any disclaimer, the term of this patent is extended or adjusted under 35 U.S.C. 154(b) by 876 days.

(21) Appl. No.: 13/496,954

(22) PCT Filed: Sep. 17, 2010

(86) PCT No.: PCT/EP2010/063710
§ 371 (c)(1),
(2), (4) Date: Mar. 19, 2012

(87) PCT Pub. No.: WO2011/033070
PCT Pub. Date: Mar. 24, 2011

(65) Prior Publication Data
US 2012/0180851 A1    Jul. 19, 2012

(30) Foreign Application Priority Data
Sep. 18, 2009 (DE) .................... 10 2009 044 052

(51) Int. Cl.
| H01L 31/0747 | (2012.01) |
| H01L 31/02 | (2006.01) |
| H01L 31/0216 | (2014.01) |
| H01L 31/0224 | (2006.01) |
| H01L 31/048 | (2014.01) |
| H01L 31/068 | (2012.01) |

(52) U.S. Cl.
CPC ... *H01L 31/02021* (2013.01); *H01L 31/02167* (2013.01); *H01L 31/02168* (2013.01); *H01L 31/022466* (2013.01); *H01L 31/048* (2013.01); *H01L 31/068* (2013.01); *Y02E 10/547* (2013.01)

(58) Field of Classification Search
None
See application file for complete search history.

(56) References Cited

U.S. PATENT DOCUMENTS

| 4,144,094 A | * | 3/1979 | Coleman et al. ............. 136/256 |
| 4,343,962 A | | 8/1982 | Neugroschel et al. |
| 4,886,555 A | * | 12/1989 | Hackstein et al. ............ 136/255 |
| 5,461,002 A | * | 10/1995 | Safir ............... H01L 21/2255 |
| | | | 136/255 |

(Continued)

FOREIGN PATENT DOCUMENTS

| CN | 101044630 A | 9/2007 |
| CN | 101133500 A | 2/2008 |

(Continued)

OTHER PUBLICATIONS

Mohite et al. "Characterization of silicon oxynitride thin films deposited by electron beam physical vapor deposition technique" Materials Letters 57 (2003) 4170-4175.*
Chinese Office Action dated unknown corresponding to Chinese App. No. 2010800416464, 2 pp.
English translation of Chinese Search Report dated Apr. 28, 2014 corresponding to Chinese Application No. 2010800416464, 2 pp.
International Search Report dated May 11, 2011 corresponding to International Patent Application No. PCT/EP2010/063710.
Zhao, J., et al., "Performance Instability in N-Type Pert Silicon Solar Cells;" Centre of Excellence for Adv. Silicon Photovoltaics and Photonics, Univ. of New So. Wales, Sydney, Australia; ISFH, Emmerthal, Germany, 4pp.

(Continued)

*Primary Examiner* — Magali P Slawski
(74) *Attorney, Agent, or Firm* — Ohlandt, Greeley, Ruggiero & Perle, LLP

(57) ABSTRACT

A crystalline solar cell is provided that includes a front-sided n-doped area and a rear-sided p-doped area, a front-sided contact, a rear-sided contact and at least one front-sided first layer made from SiN. In order to reduce degradation of the parallel resistance, a second layer made of at least one material selected from the group SiN, SiOx, Al2Ox, SiOxNy: Hz, a-Si:H, TiOx or containing said type of material is disposed between the first layer and the n-doped area and is then doped for forming imperfections.

26 Claims, 2 Drawing Sheets

(56) References Cited

U.S. PATENT DOCUMENTS

Figure 1:
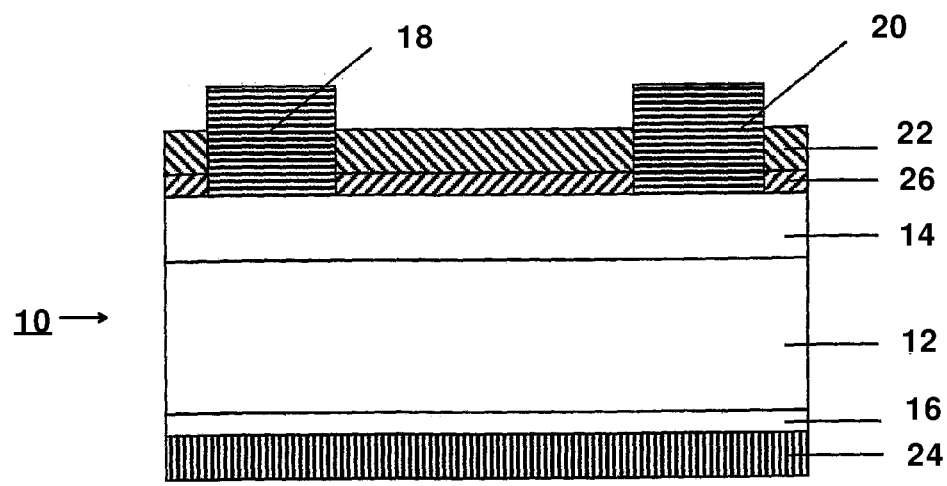

| | | | |
|---|---|---|---|
| 7,554,031 B2 | 6/2009 | Swanson et al. | |
| 2003/0106581 A1* | 6/2003 | Shibuya et al. | 136/260 |
| 2004/0081747 A1* | 4/2004 | Lauinger et al. | 427/58 |
| 2005/0126627 A1* | 6/2005 | Hayashida | 136/257 |
| 2006/0196535 A1 | 9/2006 | Swanson et al. | |
| 2008/0156370 A1* | 7/2008 | Abdallah | H01L 31/075 136/258 |
| 2008/0223446 A1* | 9/2008 | Wang | C03C 3/064 136/265 |
| 2009/0126791 A1* | 5/2009 | Lu | B32B 17/10036 136/258 |
| 2010/0012179 A1* | 1/2010 | Cheng | H01L 31/02168 136/256 |
| 2010/0059114 A1* | 3/2010 | Park et al. | 136/256 |
| 2010/0275982 A1* | 11/2010 | Abbott et al. | 136/255 |
| 2011/0297207 A1* | 12/2011 | Ishihara et al. | 136/246 |
| 2012/0073647 A1* | 3/2012 | Stangl | H01L 31/02244 136/256 |
| 2015/0299568 A1* | 10/2015 | Nakako | H01L 31/022425 136/252 |

FOREIGN PATENT DOCUMENTS

| | | |
|---|---|---|
| CN | 101611497 A | 12/2009 |
| JP | 02201972 A | 8/1990 |
| JP | 2005026193 A | 1/2005 |
| TW | I378499 B | 12/2012 |
| WO | 2007013806 A1 | 2/2007 |
| WO | 2007/022955 | 3/2007 |
| WO | 2008/072828 | 6/2008 |
| WO | 2008/115814 | 9/2008 |

OTHER PUBLICATIONS

Swanson, R., et al., "The Surface Polarization Effect in High-Efficiency Silicon Solar Cells;" 15th International Photovoltaic Science & Eng. Conference (PVSEC-15), Shangai, China, 2005, pp. 410-411.

Welter, P., "Zu gute Zellen" [Too good cells], Photon, Apr. 2006, p. 102 (w/ English abstract).

Rutschmann, I., "Notch nicht ausgelernt" [Not yet finished learning], Photon, Jan. 2008, p. 122 (w/ English abstract).

Rutschmann, I., "Poloarization ueberwunden" [To overcome polarization], Photon, Aug. 2008, p. 124 (w/ English abstract).

Japanese Office Action dated Oct. 14, 2014 corresponding to Japanese Patent Application No. 2012-529287 with English translation, 6 Pages.

Chinese Office Action dated Apr. 28, 2014 corresponding to Chinese Patent Application No. 201080041646.4 with English translation, 23 Pages.

Joshi, "LPCVD ans PECVD Silicon Nitride for Microelectronics Technology", Indian Journal of Engineering & Material Sciences, vol. 7, Oct.-Dec. 2000, pp. 303-309.

Claassen, "Influence of Deposition Temperature, Gas Pressure, Gas Phase Composition, and RF Frequency on Composition and Mechanical Stress of Plasma Silicon Nitride Layers", J. Electrochem Soc., Apr. 1985, pp. 893-898.

* cited by examiner

CRYSTALLINE SOLAR CELL, METHOD FOR PRODUCING SAID TYPE OF SOLAR CELL AND METHOD FOR PRODUCING A SOLAR CELL MODULE

The invention relates to a crystalline solar cell having a front-side n-doped area and a back-side p-doped area, a front-side contact, a back-side contact, and at least one front-side first layer made from SiN or containing SiN as an anti-reflection layer. The invention also relates to a method for producing a crystalline solar cell having a front-side n-doped area, a back-side p-doped area, front- and back-side contacts, and at least one front-side layer made from SiN or containing SiN as first layer as an anti-reflection layer. Furthermore, the subject of the invention is a method for producing a solar cell module, comprising interconnected solar cells, each of which has a front-side n-doped area, a back-side p-doped area, a front-side contact, a back-side contact, at least one front-side layer made from SiN or containing SiN, and, between the at least one front-side layer made from SiN or containing SiN and the n-doped area, a layer made from at least one material from the group SiN, $SiO_x$, $Al_2O_x$, $SiO_xN_y$:Hz, a-Si:H, $TiO_x$, the solar cells being covered on the front side by an optically transparent embedding material made from plastic, an electrically insulating, optically transparent cover made from glass or plastic being disposed above the embedding material, and the unit thus formed having a preferably surrounding metal frame around it.

The n- and p-doped areas in a pn diode produce a space-charge region in which electrons from the n layer migrate into the p layer and holes in the p-layer migrate into the n layer. When a voltage is applied to the metal electrodes located on the n- and p-doped layers, a high current flows if the voltage at the negative electrode is negative. When the polarity is reversed, an appreciably smaller current flows.

A special design of Si pn diodes involve solar cells or photodetectors in which part of the front side is provided with an at least partially transparent layer that has at least a reflection-reducing effect. Light penetrates through this layer into the silicon and is partially absorbed there. In the process, surplus electrons and holes are set free. The surplus electrons migrate in the electric field of the space-charge region from the p-doped area to the n-doped area and finally to the metal contacts on the p-doped area; the surplus holes migrate from the n-doped area into the p-doped area and finally to the metal contacts on the p-doped area. When a load is applied between the positive and negative electrodes, a current flows.

In general, many solar cells are interconnected in series by way of metal connectors and laminated in a solar module composed of several insulation layers so as to protect them from the influence of weathering. A problem is that, due to the series connection of solar cells and the series connection of several modules to form a system, system voltages of several hundred volts normally occur. This gives rise to high electric fields between solar cells and ground potential, which lead to undesired displacement currents and leakage currents. As a result, charges can be deposited permanently on the surface of the solar cells and can appreciably reduce their efficiency. Charges can also accumulate on the surface under illumination or during prolonged storage in the dark.

The degradation of the no-load voltage is known, as is also, but to a lesser extent, the short-circuit current owing to charges on the front side of double-sided contacted silicon solar cells with an n-type basic doping and a p-doped front side (J. Zhao, J. Schmidt, A. Wang, G. Zhang, B. S. Richards, and M. A. Green, "Performance instability in n-type PERT silicon solar cells," Proceedings of the 3$^{rd}$ World Conference on Photovoltaic Solar Energy Conversion, 2003). The no-load voltage and short-circuit current are strongly degraded under illumination and during prolonged storage in the dark. Identified as a reason for the degradation was the accumulation of positive charges in the silicon nitride and/or silicon oxide on the front side. They lead to depletion of the silicon surface and thus to an increase in the surface recombination rate for minority charge carriers. It is characteristic that the parallel resistance and thus the fill factor are not negatively affected thereby.

Also observed was the degradation of the no-load voltage and short-circuit current owing to charges on the front side for double-sided contacted silicon solar cells with n-type basic doping, an n-doped front side, and a p-doped back side (J. Zhao, op. cit.). They likewise undergo strong degradation under illumination and during prolonged storage in the dark owing to the accumulation of negative charges in the silicon nitride and/or silicon oxide on the front side. In this case, the negative charges lead to the depletion of the n-doped silicon surface and thus, in turn, to an increase in the surface recombination rate. In this case, it is also characteristic that the parallel resistance and thus the fill factor are not negatively affected.

For modules that contain back-side contacted solar cells with n-type basic doping, an n-doped front side, and local p- and n-doped areas on the back side of the substrate, a degradation due to charges is known (see: R. Swanson, M. Cudzinovic, D. DeCeuster, V. Desai, J. Jürgens, N. Kaminar, W. Mulligan, L. Rodrigues-Barbosa, D. Rose, D. Smith, A. Terao, and K. Wilson, "The surface polarization effect in high-efficiency silicon solar cells," Proceedings of the 15$^{th}$ International Photovoltaic Science & Engineering Conference, p. 410, 2005: Hans Oppermann, "Solarzelle" [Solar cells], Patent Application WO 2007/022955, and Philippe Welter, "Zu gute Zellen" [Too good cells], Photon, p. 102, April 2006). If these modules have a high positive potential relative to ground, negative charges migrate onto the front side of the solar cells, to which no contacts are attached. There, because of the low electrical conductivity of the module assembly, they can remain over a long period of time, even after the system voltage is switched off. As a result, the surface recombination rate on the front side is increased and thus the no-load voltage and short-circuit current are reduced. Interestingly, a reduction of the fill factor was also reported. No degradation occurs when the positive pole of the system is grounded, that is, when a priori only negative system voltages are allowed. Apparently, therefore, positive charges on the front side of this type of solar cell do not lead to degradation. If degradation has already taken place owing to negative charges on the front side, the degradation can be temporarily reversed by pole reversal of the system voltage in the dark or overnight, that is, by applying a high negative potential relative to ground (regeneration by means of a compensation voltage). In the process, negative charges flow away from the surface of the solar cells. On the next day, however, the degradation resumes owing to high positive system voltage, so that the regeneration must be carried out once again every night.

Furthermore, in R. Swanson, op. cit., it was proposed, in order to prevent the accumulation of charges on the front side of solar cells in which all pn transitions and metal contacts are located on the back side of the substrate, to apply a conductive coating onto the anti-reflection layer on the front side and to connect this coating conductively with the plus or minus pole of the solar cells on the back side.

In comparison to the types of solar cells described above, double-sided contacted silicon solar cells with p-type basic doping and an n-doped front side are appreciably less sensitive to changes in the surface recombination rate on the front side. For this reason, only a small degradation of the no-load voltage was found under illumination and during prolonged storage in the dark (J. Zhao, op. cit.).

In Ines Rutschmann, "Noch nicht ausgelernt" [Not yet finished learning], Photon, p. 122, January 2008, and Ines Rutschmann, "Polarisation überwunden" [To overcome polarization], Photon, p. 124, August 2008, it is described that modules with double-sided contacted silicon solar cells having p-type basic doping and an n-doped front side have low parallel resistances and thus also low fill factors following the action of high negative system voltages. This is a sign of an interaction between emitter and base and is thus fundamentally different from the above-described effects on the surface recombination rate. By way of treatment at elevated temperatures and high humidity, the degraded modules partially regain their efficiency. At high positive system voltages, no degradation was found and modules that were already degraded could be regenerated temporarily by applying a high positive potential relative to ground in the dark; that is, a regeneration by means of compensation voltage is possible in this case as well, albeit with reversed poles, as for the above-described modules that contain back-side contacted solar cells with n-type basic doping, an n-doped front side, and local p- and n-doped areas on the back side of the substrate. At high negative system voltages, the degradation resumes, so that the regeneration by means of compensation voltage must also be repeated regularly in this case as well. Furthermore, it is reported that the degradation of modules at high negative system voltages is caused by the front-side metallization process used, a special transfer printing (see Rutschmann, op. cit.).

A solar cell that is composed of an n-doped front-side area and a p-doped back-side area, a front-side contact, a back-side contact, and at least one first front-side layer, which may be composed of silicon dioxide and serve as an anti-reflection layer is known from U.S. Pat. No. 4,343,962. The layer may also contain nitrides.

A solar cell with an anti-reflection front layer composed of silicon nitride having imperfections is described in U.S. Pat. No. 4,144,094.

A back-side contact solar cell that has an n-type basic doping is known from U.S. Pat. No. 7,554,031. In order to prevent damaging polarization in solar cell modules assembled from corresponding solar cells, a bias voltage is applied to one area of the solar cell module.

The present invention is based on the problem of further developing a crystalline solar cell, a method for producing said type of solar cell, and a method for producing a solar cell module of the type explained initially such that the degradation of the parallel resistance and thus the fill factor are reduced, in particular for double-sided contacted silicon solar cells with p-type basic doping, an n-doped front side, and an anti-reflection layer composed of silicon nitride, owing to high negative system voltages or positive charges on the front side.

In order to solve the problem, the invention essentially provides a crystalline solar cell that is characterized in that, between the first layer and the n-doped area, a second layer made of at least one material from the group SiN, $SiO_x$, $Al_2O_x$, $SiO_xN_y$:Hz, a-Si:H, $TiO_x$, or containing such a material is disposed and is doped for the creation of imperfections.

The second layer composed of SiN or containing SiN should contain a silicon-nitrogen ratio of 1 to 2.2 and an H atom concentration of greater than 10%.

In order to achieve an even more improved stability, it is provided that positive and/or negative charge carriers are incorporated into the first layer after producing the first layer.

Preferably, the charge density per unit area of the charge carriers is $>1\times10^{12}/cm^2$.

In particular, after production of the solar cells, a negative voltage $U_n$ should be applied to them over a predetermined time.

The invention is also characterized in that, after producing the solar cells, positive charges are deposited on them.

Insofar as the second layer is composed of SiN or contains SiN, it should have a refractive index n of n≥2, in particular between 2.1 and 3.0.

Preferably, the second layer should be formed with a thickness $D_1$ of 1 nm≤$D_1$≤50 nm.

Surprisingly, it was demonstrated that, when imperfections are introduced into the front-side silicon nitride layer or into a silicon nitride layer present between the front-side layer and the n-doped area of the solar cell, the degradation of the parallel resistance is strongly prevented or at least strongly reduced. The imperfections are produced, in particular, by doping with an element from the group P, N, Sb, Bi, C, O, B, Al, Ga, In, Tl, Cu, V, W, Fe, Cr.

In place of the silicon nitride layer, it is also possible to provide a layer made from another material, preferably $SiO_x$, $Al_2O_x$, $SiO_xN_y$:$H_z$, a-Si:H, or $TiO_x$.

Imperfections may be produced in the second layer by doping with at least one element from the group P, N, Sb, Bi, C, O, B, Al, Ga, In, Tl, Cu, V, W, Fe, Cr.

In one embodiment, the layer is composed of $SiO_x$ that was produced by means of UV illumination of the silicon substrate at wavelengths λ<400 nm in an oxygen-containing atmosphere. In another embodiment, the layer is composed of $SiO_x$ that was produced at temperatures in the range between 300 and 1000° C. in an oxygen-containing atmosphere.

Due to the additional layer, the creation of low parallel resistances at high negative system voltages or after positive charges have been deposited on the front side of the solar cells is strongly reduced in comparison to other solar cells in which the silicon nitride layer was deposited directly on the n-doped front side.

Furthermore, the invention is characterized by a method for producing a crystalline solar cell with a front-side n-doped area, a back-side p-doped area, front-side and back-side contacts, and at least one front-side first layer of SiN or containing SiN, as an anti-reflection layer, characterized in that, between the first layer and the n-doped area, a second layer is disposed, which is composed of at least one material from the group SiN, $SiO_x$, $Al_2O_x$, $SiO_xN_y$:$H_z$, a-Si:H, $TiO_x$ or contains said material, and that, after producing the solar cell, either a negative potential $U_n$ is applied to the solar cell or else positive and/or negative charge carriers are introduced into the first layer. Furthermore, the second layer should be doped with preferably an element from the group P, N, Sb, Bi, C, O, B, Al, Ga, In, Tl, Cu, V, W, Fe, Cr in order to form imperfections.

Accordingly, another solution of the problem provides that the solar cell—as described above—is furnished with an additional layer between the silicon substrate and the silicon nitride layer and, in addition, positive charges are deposited on the solar cell. In this process, the solar cell is present advantageously at temperatures in the range of 10° C. to 600° C.

One solution of the problem further provides that the solar cell—as described above—is furnished with an additional layer between the silicon substrate and the silicon nitride layer and, after being laminated into a module of the solar cell assembly, is loaded temporarily with high negative voltage relative to ground. In the process, the module should be present at temperatures in the range of 10° C. to 220° C.

Surprisingly, it was found that, with progressive deposition of positive charges onto the solar cell or with progressive application of high negative voltage to the module relative to ground, the parallel resistance of the solar cell or the solar cell module initially declines, but then rises once again nearly to its initial value and hence the degradation is practically fully reversed. The parallel resistance remains permanently at this high value, even when no additional positive charges are deposited any longer on the solar cell or no negative voltage relative to ground is applied any longer to the solar cell assembly in the module. High temperatures accelerate this process of permanent regeneration.

In particular, a negative voltage should be applied to the solar cell and/or positive and/or negative charges should be introduced into the first layer at a temperature between 50° C. and 200° C., preferably 80° C.

The method according to the invention differs fundamentally from the temporary regeneration that is known for solar cells without any additional layer between the silicon substrate and the silicon nitride layer and was observed with application of a positive voltage.

Another proposed solution of the problem on which the invention is based provides that an optically transparent, conductive coating is applied to the front side of the double-sided contacted silicon solar cells with p-type basic doping, an n-doped front side, and an anti-reflection layer composed of silicon nitride. As a result, the anti-reflection layer and the front-side metal contacts are connected conductively with one another without any further measures. Because front-side metal contacts are connected conductively, in turn, with the n-doped front side, the anti-reflection layer remains free of electrical fields even at high system voltages and thus no charges are introduced into the anti-reflection layer.

A method for producing a solar cell module of the type described initially is characterized in that the frame is loaded with high electrical voltage over a predetermined time with respect to at least one junction of the solar cell module. In this case, it is provided, in particular, that, a positive electrical voltage of between 100 V and 20,000 V is applied between the frame and the at least one electrical contact, preferably the positive electrical voltage being applied over a time $t_1$ of 0.5 sec$\leq t_1 \leq$1200 min.

An alternative solution for producing a solar cell module provides that an electrically conducting fluid, an electrically conducting plastic film, or an electrically conducting metal foil is placed on the solar cell module over a time $t_2$ and a high positive electrical voltage is applied to it relative to at least one of the electrical contacts of the solar cell module over a predetermined time $t_3$. In the process, a positive electrical voltage of between 100 V and 20,000 V should be applied between the conducting fluid or the plastic film or the metal foil and the at least one electrical contact.

In particular, it is provided that the fluid or plastic film or metal foil is disposed on the solar cell module over a time $t_2$ of 0.5 sec$\leq t_2 \leq$1200 min or the positive electrical voltage is applied over a time $t_3$ of 0.5 sec$\leq t_3 \leq$1200 min.

Furthermore, the invention relates to a solar cell module comprising interconnected crystalline p- or n-type solar cells, each of which has a front-side n- or p-doped area, a back-side p- or n-doped area, a front-side contact, a back-side contact, and at least one front-side layer made of SiN or containing SiN, the solar cells being covered on the front side by an optically transparent embedding material made of plastic, an electrically insulating, optically transparent cover made of glass or plastic being disposed on the embedding material, the solar cells being covered on the back side by an embedding material made of plastic, and the unit thus formed having a surrounding metal frame around it, and the solar cell module is characterized in that, between the front-side plastic embedding material and the cover, an electrically conducting and at least partially optically transparent layer is disposed, which is connected to one of the electrical contacts of the solar cell module in an electrically conductive manner.

On the basis of the teaching according to the invention, the degradation of the parallel resistance to the pn transition is at least reduced or permanently prevented, so that the efficiency of the solar cells and thus of the solar cell module is not unallowably decreased. In this case, according to a proposed solution for permanent regeneration of an initially reduced parallel resistance, a direct-current voltage is applied between at least one junction of the solar cell or the solar cell module and ground and, namely, in the case of p-doped crystalline silicon solar cells with a p-doped substrate and an n-doped front side, a negative voltage is applied, provided that an intermediate layer is incorporated that is not composed of silicon nitride, but rather a layer that is preferably composed of at least one material from the group $SiO_x$, $Al_2O_x$, $SiO_xN_y$:Hz, a-Si:H, or $TiO_x$.

A silicon nitride layer having imperfections—whether it is an intermediate layer or the frontside silicon nitride layer as an anti-reflection layer—does not require a corresponding applied voltage.

Instead of applying a voltage, it is also possible to introduce negative charge carriers, in particular, into the front-side silicon nitride layer, which bring about the same effect. In order for the negative charge carriers to be introduced, positive charges are deposited on the top side of the solar cell preferably by means of corona discharge. In this case, too, a permanent regeneration occurs after initial reduction of the parallel resistance.

The introduction of charge carriers into the silicon nitride layer is accomplished in that, through bringing up positive charge carriers from the silicon nitride, negative charge carriers enter the silicon nitride layer and remain there, so that, subsequently, the positive charges can be removed from the top side of the solar cell.

The introduction of charge carriers or the application of a high voltage is also unnecessary when the solar cells, on their top side, or the solar cell modules are covered with an electrically conducting, at least partially optically transparent layer preferably above the insulation layer, such as EVA, embedding the individual solar cells, said layer then being connected to the preferably strip- or point-like front contact when the layer is applied directly onto the solar cell or else being connected optionally with the front or back contact when said layer is applied to the insulation layer.

Therefore, the invention is characterized according to an independent proposed solution also by a crystalline solar cell with a front-side n-doped area, a back-side p-doped area, a front-side contact, a back-side contact, and at least one front-side first layer made of SiN or containing SiN as an anti-reflection layer, in that an electrically conducting or at least partially optically transparent third layer is disposed on the first layer or on an insulation layer extending over the former, said third layer, in the case of an arrangement on the first layer, being connected to the front contact and, for an arrangement on the insulation layer, being connected to the front or back contact in an electrically conductive manner.

Further details, advantages, and features of the invention ensue not only from the claims and the features to be taken from the claims—alone and/or in combination—but also from the following description of the preferred embodiment examples and the drawings.

Figure 2:
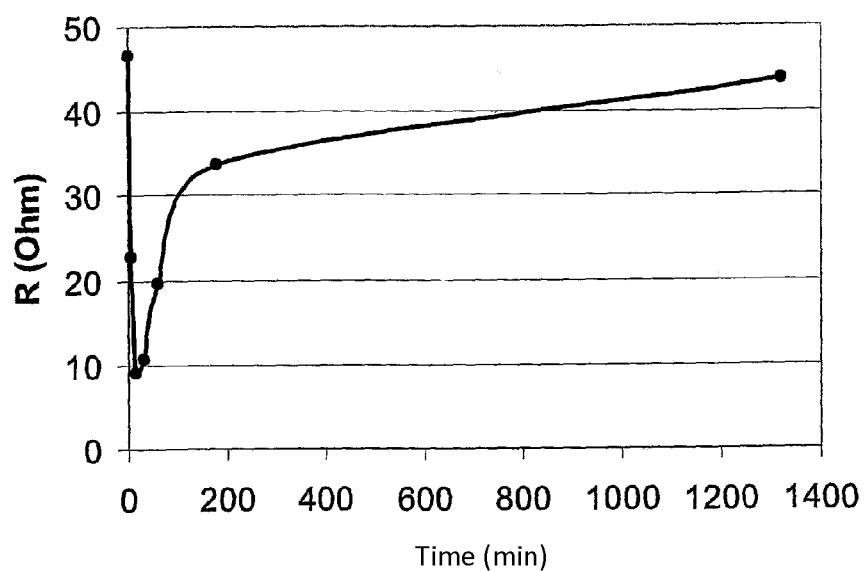
Figure 3:
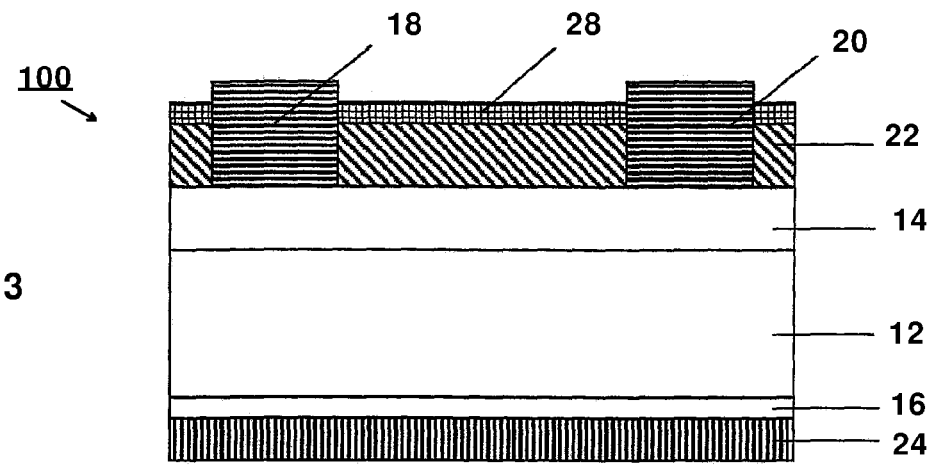
Figure 4:
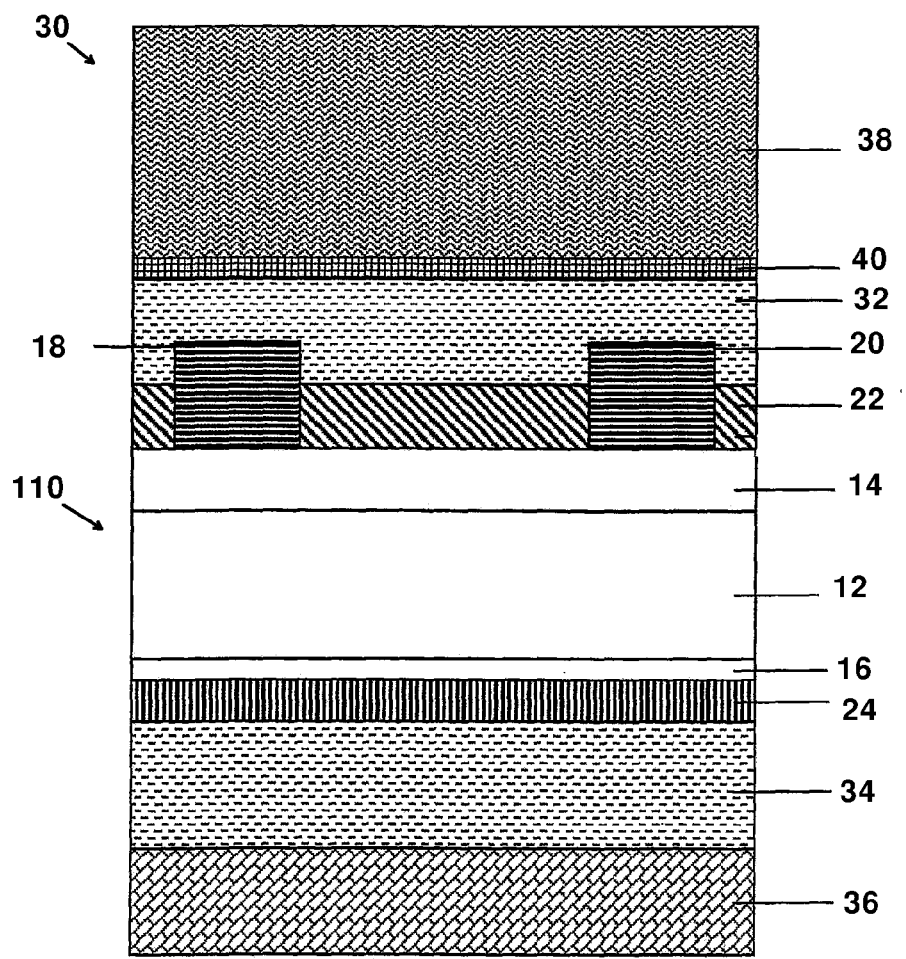

Shown are:

FIG. 1 a first embodiment of the silicon solar cell with improved stability at high negative system voltages, FIG. 2 measured parallel resistance of a silicon solar cell with improved stability at high negative system voltages as a function of the charging time with positive charges, FIG. 3 another embodiment of the silicon solar cell with improved stability at high negative system voltages, and FIG. 4 an embodiment of a solar module with improved stability at high system voltages.

In the following description of preferred embodiment examples, it is assumed that the structure and function of a solar cell or a solar cell module are sufficiently known, particularly in reference to crystalline silicon solar cells with p-type basic doping and modules produced from them.

Furthermore, it should be noted that the invention also includes solar cells that have several silicon nitride layers on the front side, as is known from the prior art. In this respect, the term front-side silicon nitride layer is also to be understood as a synonym for one or more front-side silicon nitride layers. Furthermore, the given dimensions are to be basically understood as being given purely by way of example, without the teaching according to the invention being thereby limited.

Illustrated in FIG. 1 in a purely schematic manner is a crystalline silicon solar cell 10. It has a p-type doped substrate 12 in the form of a 180-μm thick silicon wafer, for example, which is n$^+$-doped on its front side, that is, over the entire front-side surface. The corresponding area is marked by reference 14. On its back side, substrate 12 is p$^+$-diffused (area or layer 16). Further found on the front side are strip- or point-like front contacts 18, 20. The front side of the solar cell has an anti-reflection layer 22 composed of silicon nitride, which, for example, can have a refractive index of 1.9. Disposed on the entire surface of the back side is a back contact 24.

In accordance with the invention, according to one embodiment, another silicon nitride layer 26, which is to be referred to as a second layer, is disposed between the front-side or first silicon nitride layer 22 and the n$^+$-diffused area 14 and has a refractive index of 2.3, for example, and a thickness of 25 nm.

By introducing the intermediate layer, that is, the second layer 26, between anti-reflection layer 22 and the n$^+$ area 14, a degradation of the parallel resistance to the pn transition, which exists between layers 12, 14, is prevented or strongly reduced. Intermediate layer 26 has imperfections or defect areas due to doping. Coming into consideration as doping agent is preferably an element from the group P, N, Sb, Bi, C, O, B, Al, Ga, In, Tl, Cu, V, W, Fe, Cr.

A degradation of the parallel resistance must be prevented, because, if it degrades too strongly, a quasi short circuit in the pn transition occurs, so that the solar cell is no longer able to function properly.

Instead of intermediate layer 26 composed of silicon nitride, a layer made of another material, such as SiO$_x$, Al$_2$O$_x$, SiO$_x$N$_y$:Hz, a-Si:H, and/or TiO$_x$, can be inserted in order to prevent the degradation of the parallel resistance as a result of high system voltages and the charge on the front side of the solar cell or a module composed of corresponding solar cells. In this case, after production of the solar cell or after interconnection of corresponding solar cells to create a module, a high negative direct-current voltage relative to ground is applied to one of the contacts of the solar cell or solar cell module, that is, to the plus or minus pole or to both contacts. Coming into consideration as a doping agent for the layer is, in particular, an element from the group P, N, Sb, Bi, C, O, B, Al, Ga, In, Tl, Cu, V, W, Fe, Cr.

Alternatively, positive charges may be deposited on the solar cell, namely, on its front side, for example by means of a corona discharge. In this way, negative charges, in particular, are introduced into the corresponding intermediate layer, said charges coming from the n$^+$ layer, and, as a result, a corresponding degradation is likewise prevented or reduced. This will be illustrated by FIG. 2. Thus, FIG. 2 shows the time curve of parallel resistance to the pn transition for a solar cell according to the invention, in which, corresponding to the teaching of the invention, an intermediate layer made of SiO$_x$ is disposed between the front-side silicon nitride layer 22, which, as mentioned, may be composed of several layers, and the n$^+$ area 14, which may also be referred to as a layer. The measurements in this case are made on a crystalline silicon solar cell, for which the refractive index n of the silicon nitride layer 22 is n=2.1 for a layer thickness of 80 nm. The intermediate layer had a thickness of approximately 2 nm and was produced from the n$^+$ layer by means of UV light with a wavelength <300 nm.

Subsequently, positive charge was deposited on the front side of the corresponding solar cell by corona discharge. The parallel resistance was measured in accordance with FIG. 2. It can be seen that, after initial reduction of the parallel resistance, a permanent regeneration occurs after approximately 15 min.

Another embodiment of a solar cell 100 may be taken from FIG. 3. Instead of the intermediate layer 26, an optically transparent, electrically conducting layer 28, which may be composed of indium tin oxide or zinc oxide, is deposited on the front-side silicon nitride layer 22. The layer 28 thus covers the anti-reflection layer 22 and can also extend over front contacts 18, 20. In the embodiment, front contacts 18, 20 are left free. Regardless thereof, an electrically conducting connection between layer 28 and front contacts 18, 20 is provided. Through the measures in this regard, a degradation of the parallel resistance can likewise be prevented or strongly reduced.

Solar cells according to the invention of the type explained above are interconnected to create solar cell modules in order to achieve an improved stability thereof at high system voltages. Illustrated in FIG. 4 is an excerpt from a corresponding module 30 containing a solar cell 10.

In a known way, solar cells 110 are surrounded on the front side and back side by a transparent plastic layer made of ethylene vinyl acetate (EVA), for example, and are embedded therein. The corresponding layers are marked with the references 32, 34. Furthermore, a back-side film 36, which may be composed of polyvinyl fluoride (TEDLAR), for example, extends on the back side along EVA layer 34. On the front side, EVA layer 32 is covered by a glass plate 36. The unit thus formed is surrounded by a metal frame, which is grounded.

In accordance with the invention, a transparent, electrically conducting layer 40, which may be composed of indium tin oxide or zinc oxide, is disposed between frontside EVA layer 32 and glass plate 38. The corresponding layer 38 is then connected to one pole of the module, that is, to the plus or minus pole. A corresponding arrangement likewise offers the advantages of the invention that have also been explained in connection with FIG. 3.

Instead of solar cell 110, solar cells 10, 100, or similar cells may be interconnected to create a module, said solar cells being in accordance with the above explanations of the teaching of the invention.

The invention claimed is:

1. A crystalline silicon solar cell, comprising:
   a front-side n-doped area;
   a back-side p-doped area;
   a front-side contact;
   a back-side contact;
   a first layer comprising SiN as an anti-reflection layer, the first layer having positive charge carriers incorporated therein after the first layer is produced; and
   a second layer disposed between the first layer and the front side n-doped area, wherein the second layer is made of at least one material selected from the group consisting of SiN, $SiO_x$, $Al_2O_x$, $SiO_xN_y$:$H_z$, and a-Si:H, and wherein the second layer is doped with at least one element for the creation of imperfections, wherein the at least one element is selected from the group consisting of P, B, and Ga, and any combinations thereof, and wherein the front-side contact is disposed directly on the front-side n-doped area and penetrates through the first layer and the second layer such that the front-side n-doped area and the front-side contact are in direct electric contact.

2. The solar cell according to claim 1, wherein the second layer has a refractive index that is greater than or equal to 2.

3. The solar cell according to claim 1, wherein the positive charge carriers comprise a charge density per unit area of greater than $1 \times 10^{12}/cm^2$.

4. The solar cell according to claim 1, wherein after producing the solar cell, a negative voltage $U_n$ is applied to the solar cell over a predetermined time to introduce the positive charge carriers into the first layer.

5. The solar cell according to claim 1, further comprising positive charges deposited thereon.

6. The solar cell according to claim 1, further comprising an electrically conducting and at least partially optically transparent third layer disposed on the first layer, the third layer being connected in an electrically conductive manner to the front-side contact.

7. The solar cell according to claim 1, wherein the second layer has a thickness $D_2$ of 1 nm≤$D_2$≤50 nm.

8. The solar cell according to claim 1, wherein the second layer is an $SiO_x$ layer that is formed from the front-side n-doped area.

9. The solar cell according to claim 1, wherein the second layer is doped with at least one second element selected from the group consisting of N, Sb, Bi, C, O, Al, In, Tl, Cu, V, W, Fe, Cr, and any combination thereof.

10. The solar cell according to claim 6, wherein the third layer comprises indium tin oxide or zinc oxide.

11. The solar cell according to claim 1, wherein the second layer is formed from a material other than SiN, and wherein the first layer has a refractive index n of n≥2.0.

12. The solar cell according to claim 1, wherein the second layer comprises SiN, and wherein the first layer has a refractive index that is smaller than a refractive index of the second layer.

13. The solar cell according to claim 1, wherein the solar cell has p-type basic doping.

14. The solar cell according to claim 1, wherein the solar cell is made by a method comprising:
   disposing the second layer between the first layer and the front-side n-doped area, wherein the second layer is made of at least one material selected from the group consisting of $SiO_x$, $Al_2O_x$, $SiO_xN_y$:$H_z$, and a-Si:H;
   doping the second layer with the at least one element for the creation of imperfections; and
   introducing positive charge carriers into the first layer.

15. The solar cell according to claim 14, wherein the method of making the solar cell further comprises doping the second layer with at least one second element selected from the group consisting of N, Sb, Bi, C, O, Al, In, Tl, Cu, V, W, Fe, and Cr, and any combinations thereof.

16. The solar cell according to claim 14, wherein the method of making the solar cell further comprises introducing the positive charge carriers into the first layer by deposition of positive charges on the front side n-doped area of the solar cell.

17. The solar cell according to claim 16, wherein the method of making the solar cell further comprises depositing the positive charges on the front side n-doped area of the solar cell by corona discharge.

18. The solar cell according to claim 14, wherein the step of introducing the positive charge carriers occurs at a temperature of between 50° C. and 200° C.

19. The solar cell according to claim 14, wherein the method of making the solar cell further comprises forming an $SiO_x$ layer as the second layer from the front-side n-doped area in an oxygen-containing atmosphere at a temperature T of 150° C. ≤T≤1000° C.

20. The solar cell according to claim 14, wherein the method of making the solar cell further comprises forming the second layer in the form of an $SiO_x$ layer from the front-side n-doped area in an ozone-containing atmosphere or by use of an ozone-containing liquid.

21. The solar cell according to claim 14, wherein the method of making the solar cell further comprises forming the second layer in the form of an $SiO_x$ layer at a pressure of between $10^{-5}$ and 0.5 bar.

22. The solar cell according to claim 14, wherein the method of making the solar cell further comprises forming the second layer in the form of an $SiO_x$ layer with a thickness $D_2$ of 1 nm≤$D_2$≤50 nm.

23. The solar cell according to claim 14, wherein the method of making the solar cell further comprises forming the second layer in the form of an $SiO_x$ layer from the front-side n-doped area in an oxygen-containing atmosphere by UV light with a wavelength λ of λ<400 nm.

24. The solar cell according to claim 16, wherein the method of making the solar cell further comprises depositing the positive charges at a temperature $T_2$ of 10° C.≤$T_2$≤600° C.

25. The solar cell according to claim 14, wherein the method of making the solar cell further comprises applying a negative voltage $U_n$ to the solar cell over a predetermined time after producing the solar cell to introduce the positive charge carriers into the first layer.

26. The solar cell according to claim 25, wherein the step of applying the negative voltage occurs at a temperature of between 50° C. and 200° C.

* * * * *